United States Patent
Zitzmann et al.

(10) Patent No.: US 7,746,213 B2
(45) Date of Patent: Jun. 29, 2010

(54) DEVICE AND METHOD FOR MANUFACTURING THE SAME

(76) Inventors: Heinrich Zitzmann, Bluetenweg 14, Lauf an der Pegnitz (DE) 91207; Georg Bernitz, Vordere Marktstrasse 9, Nuernberg (DE) 90441

( * ) Notice: Subject to any disclaimer, the term of this patent is extended or adjusted under 35 U.S.C. 154(b) by 126 days.

(21) Appl. No.: 11/450,713

(22) Filed: Jun. 9, 2006

(65) Prior Publication Data
US 2006/0225269 A1    Oct. 12, 2006

Related U.S. Application Data

(63) Continuation of application No. PCT/EP2004/014115, filed on Dec. 10, 2004.

(30) Foreign Application Priority Data
Dec. 12, 2003    (DE) .................. 103 58 282

(51) Int. Cl.
    *H01C 3/04*    (2006.01)
(52) U.S. Cl. ............................................. 338/25
(58) Field of Classification Search ............. 338/25
    See application file for complete search history.

(56) References Cited

U.S. PATENT DOCUMENTS 5,929,746 A    7/1999    Edwards, Jr. et al.
6,014,073 A *  1/2000    Torii et al. .............. 338/25
6,021,050 A *  2/2000    Ehman et al. .......... 361/793
6,151,771 A *  11/2000   Tzeng et al. ........... 29/610.1
6,782,604 B2 * 8/2004    Kojima et al. .......... 29/612
7,163,609 B2 * 1/2007    Ando et al. ............ 204/425

FOREIGN PATENT DOCUMENTS

EP    0060427 A2    9/1982

* cited by examiner

*Primary Examiner*—Elvin G Enad
*Assistant Examiner*—Joselito Baisa
(74) *Attorney, Agent, or Firm*—Mayback & Hoffman PA; Gregory L. Mayback; Scott D. Smiley

(57) ABSTRACT

A method of producing a device initially includes providing a component. The component includes a first surface, a second surface opposite the first surface, a first contact formed on the first surface, a second contact formed on the second surface, and an electrical circuit disposed between the first contact and the second contact. The component further includes a conductive connection between the first contact on the first surface of the component and the second surface of the component. A first conductive layer serving as the pad of the device is formed on the second surface of the component such that same is in contact with the conductive connection.

9 Claims, 4 Drawing Sheets

DEVICE AND METHOD FOR MANUFACTURING THE SAME

CROSS-REFERENCE TO RELATED APPLICATION

This application is a continuation of co-pending International Application No. PCT/EP2004/014115, filed Dec. 10, 2004, which designated the United States and was not published in English and is incorporated herein by reference in its entirety.

BACKGROUND OF THE INVENTION

1. Field of the Invention

The present invention relates to a device and to a method for manufacturing the same, and here, in particular, to a device with pads enabling good contacting with lead wires.

2. Description of the Related Art

In the prior art, there is the tendency to shrink or to miniaturize components and electric circuits further and further, so that for example on a single wafer or substrate a multiplicity of components are manufactured in high density, which are subsequently diced for further use.

The advantage of this miniaturization consists in that on the one hand the room occupied by the components may be reduced in other components, and, which is also very substantial, a multiplicity of such components can be manufactured in a single substrate, so that the resources required for the manufacture are taken advantage of more and more optimally. For one substrate, now a multiplicity of components is obtained, so that by employment of the same amount of material, increased yield may be obtained, so that the overall costs for each individual component are reduced with regard to the substrate material used corresponding to the room occupied by the component.

One problem that is encountered with this progressive miniaturization consists in that also the available contact areas for the connection of the device become smaller as the device is shrinking. For example, the available contact area in such miniaturized devices does not permit sufficient mechanical strength for the connection to lead wires or other connection locations, so that a reduced connection reliability results, in particular when lead wires are used.

An example for the solution of these problems is described in the post-published German patent application DE 103 56 367 A, in which small components are introduced into a support element such that opposing pads thereof are arranged on an upper side and a lower side of the support, respectively, which are again covered with a conductive layer, so that an enlargement of the effective pad results. This procedure is advantageous for such components, in which the components have contact areas extending across the side faces thereof, so that in a vertical arrangement thereof the corresponding pads face the upper side and the lower side of the support in a recess of the support. This procedure for the enlargement of the contact pad, however, is not suited for components in which the contact areas are arranged on a common surface.

On the basis of FIG. 1, such a conventional component is described in greater detail, which is for example a sensor chip. This component includes a substrate 100, for example a ceramic substrate. On an upper surface 102 of the ceramic substrate 100, a metal layer 104, for example a platinum film, is formed. The sensor chip includes a first contact area 106 and a second contact area 108, between which a structured platinum film 110 is arranged, for example in meander-shaped manner. Contact reinforcements 112 and 114 of conductive material are each arranged on the contact areas 106 and 108. In the example shown in FIG. 1 of a conventional temperature measurement sensor, the measurement film 110 is protected by a glaze layer 116 arranged between the contact reinforcements 112 and 114.

As can be seen, the contact areas 112, 114 are relatively small as compared with the overall dimension of the element, and with increasing miniaturization of the overall element, here also the available contact area for connection to lead wires or the like is reduced, so that here the above-mentioned problems in connection with the quality of the terminal connection arise.

SUMMARY OF THE INVENTION

Starting from this prior art, it is an object of the present invention to provide an improved method for manufacturing a device with opposing pads, as well as such a device in which improved quality of the terminal connection is achieved.

In accordance with a first aspect, the present invention provides a method of producing a temperature measurement sensor, with the steps of: providing the temperature measurement sensor including a ceramic substrate having upper and lower surfaces, a first contact and a second contact being formed on the upper surface, between which contacts a structured measurement film is disposed; producing a conductive connection between the first contact on the upper surface of the ceramic substrate and the lower surface of the ceramic substrate; producing a first conductive layer as a first pad of the temperature measurement sensor on the lower surface such that the first conductive layer is in contact with the conductive connection; producing an insulating layer on the upper surface such that the first contact and the measurement film are covered by the insulating layer, and that the second contact is at least partially exposed; and producing a second conductive layer as a second pad of the temperature measurement sensor on the insulating layer such that the second conductive layer is in contact with the second contact.

In accordance with a second aspect, the present invention provides a method of manufacturing a temperature measurement sensor, with the steps of: providing a substrate having upper and lower surfaces, the upper surface having a first contact and a second contact formed thereon, between which a structured measurement film is arranged, a thickness of the substrate being larger than a maximum dimension of the first contact and the second contact, the first contact being capable of being connected to a lead wire via a first pad, and the second contact being capable of being connected to a second lead wire via a second pad; and forming the first pad and the second pad on two side faces of the substrate.

In accordance with a third aspect, the present invention provides a temperature measurement sensor, having: a ceramic substrate having upper and lower surfaces, the upper surface having a first contact and a second contact formed thereon, between which a structured measurement film is arranged; a conductive connection between the first contact on the upper surface of the substrate and the lower surface of the substrate; a first conductive layer as a first pad of the temperature measurement sensor on the lower surface, which is arranged such that the first conductive layer is in contact with the conductive connection; an insulating layer on the upper surface, which is arranged such that the first contact and the measurement film are covered by the insulating layer, and that the second contact is at least partially exposed; and a second conductive layer as the second pad of the temperature measurement sensor on the insulating layer, which is arranged such that the second conductive layer is in contact with the second contact.

In accordance with a fourth aspect, the present invention provides a temperature measurement sensor, having: a substrate having upper and lower surfaces, the upper surface having a first contact and a second contact formed thereon, between which a structured measurement film is arranged, a thickness of the substrate being larger than a maximum dimension of the first contact and the second contact; and a first pad connected to the first contact, and a second pad connected to the second contact, wherein the temperature measurement sensor can be contacted via lead wires attachable to the pads; wherein the first pad and the second pad are formed on two side faces of the substrate.

An embodiment of the present invention provides a method for manufacturing a device, comprising:

providing a component having a first surface, a second surface opposing the first surface, a first contact formed on the first surface of the component, a second contact formed on the first surface of the component, and an electric circuit between the first contact and the second contact, wherein the component further comprises a conductive connection between the first contact on the first surface of the component and the second surface of the component; and producing a first conductive layer as a first pad of the device on the second surface of the component such that the first conductive layer is in contact with the conductive connection.

Another embodiment of the present invention also provides a method for manufacturing a device, comprising:

providing a component having a first surface, a second surface opposing the first surface, a first contact formed on the first surface of the component, a second contact formed on the first surface of the component, and an electric circuit between the first contact and the second contact;

producing a first conductive layer as first pad of the device on the second surface of the component; and producing a conductive connection between the first contact on the first surface of the component and the first conductive layer on the second surface of the component.

Furthermore, another embodiment of the present invention provides a device, with a component having a first surface, a second surface opposing the first surface, a first contact formed on the first surface of the component, a second contact formed on the first surface of the component, and an electric circuit between the first contact and the second contact, wherein the component further comprises a conductive connection between the first contact on the first surface of the component and the second surface of the component, and a first conductive layer as first pad of the device on the second surface of the component, which is in contact with the conductive connection.

According to a preferred embodiment of the present invention, in addition, a second conductive layer is produced as second pad of the device on the first surface of the component such that it is in contact with the second contact on the first surface of the component.

According to a first embodiment, the conductive connection is formed by a through connection in the component, which extends from the first contact to the second surface of the component, wherein this is achieved either after complete processing of the components by introducing a hole or before the processing of the component support by then producing the through connection in the region of the first contact to be formed and then producing the contacts as well as the electric circuit.

Alternatively, the conductive connection may be formed by a conductive layer extending from the first contact area across a side face of the component onto the second surface.

According to a further preferred embodiment of the present invention, the second conductive layer is formed by depositing an insulating layer on the first surface, so that only the second contact is still exposed, which is then contacted by the conductive layer produced on the first surface.

As an alternative to this procedure, according to another embodiment, it may be intended to provide an insulating plate the dimensions of which substantially match those of the component, and the first surface of which facing away from the component is provided with a conductive layer. The second surface facing the component is provided with a conductive layer only in a predetermined area, namely where it is to contact the second contact. The conductive portion and the conductive layer on the two surfaces of the plate are connected to each other via a through connection, and for the production of the second pad of the device the plate is applied to the first surface such that the conductive portion is in connection with the second contact.

According to a further preferred embodiment of the present invention, leads, e.g. in the shape of lead wires, are connected to the two pads, and optionally further cladding of the component with the lead wires mounted thereto may be provided, wherein the lead wires are welded on in the case of a high temperature application and the cladding is a glaze. In applications in a low temperature range, the lead wires may also be soldered on, and the cladding may be formed by a resin.

According to a further embodiment, the present invention provides a method for manufacturing a device, comprising:

providing a component having a component support comprising a first surface and a second surface opposing the first surface, a first contact formed on the first surface of the component, a second contact formed on the first surface of the component, and an electric circuit between the first contact and the second contact, wherein a thickness of the component support is greater than a maximum dimension of the first contact and the second contact;

producing a first conductive layer as first pad of the device on a first side face connecting the first surface and the second surface; and producing a second conductive layer as second pad of the device on a second side face connecting the first surface and the second surface.

According to yet another embodiment, the present invention provides a device, comprising:

a component having a component support comprising a first surface and a second surface opposing the first surface, a first contact formed on the first surface of the component, a second contact formed on the first surface of the component, and an electric circuit between the first contact and the second contact, wherein a thickness of the component support is greater than a maximum dimension of the first contact and the second contact;

a first conductive layer as first pad of the device on a first side face connecting the first surface and the second surface; and a second conductive layer as second pad of the device on a second side face connecting the first surface and the second surface.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
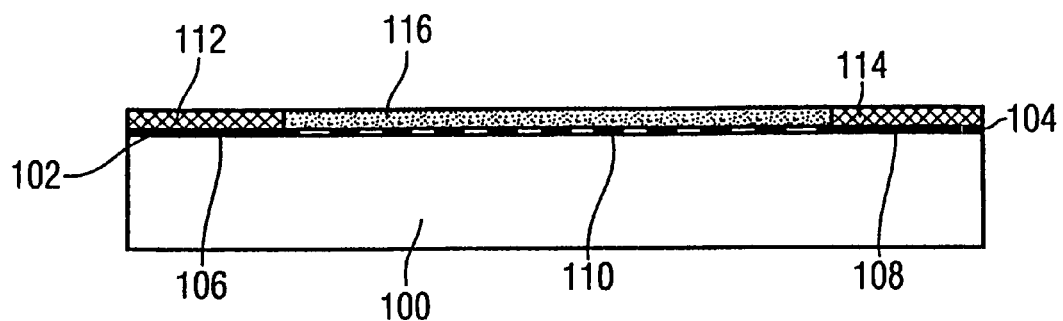
FIG. 1 is a conventional sensor device according to the prior art.

In the scope of the subsequent description of the preferred embodiments of the present invention, it is pointed out that in the various drawings like or similar elements are provided with like reference numerals.

Starting from a known sensor chip, as it is for example used for temperature sensors, heating elements, and the like, and as it has been described in more detail on the basis of FIG. 1, according to the present invention, the modifications explained in more detail in the following are made. For economical reasons, here as starting point a substrate or wafer is used, which comprises a multiplicity of individual sensors (batch). Apart from the examples of a platinum temperature sensor element used in the subsequent description, also other sensors based on metal films, such as nickel, molybdenum, tungsten, or other devices with similar configurations considering the arrangement of the contacts 106 and 108 on a common surface 102 may be used. Furthermore, at this point it is to be noted that the present invention is not limited to such devices in which the electric circuit is formed in the form of a specially structured metal film. The electric circuit 110 may rather also be formed by devices formed in the substrate 100, in which only the contacts 106 and 108 are lead out to the surface 102.

Figure 2:
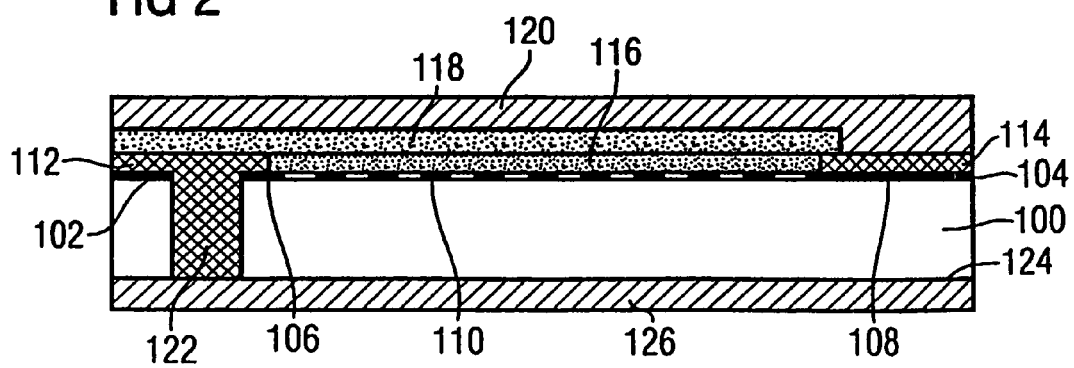
FIG. 2 is a device according to a first preferred embodiment of the present invention.

FIG. 2 shows a first embodiment of the inventive device, wherein here the elements known from FIG. 1 are provided with the same reference numerals. On the glaze 116 and on the reinforcement 112 of the first contact 106, an insulating layer 118 is arranged, which substantially covers the entire exposed upper surface of the sensor element shown in FIG. 1, except for a part of the reinforcement 114 of the second contact area 108. On the surface thus formed, a conductive layer 120 is deposited, which covers the insulating layer 118 as well as the exposed region of the contact reinforcement 114 of the second contact 108. Furthermore, a through connection 122 is formed in the substrate 100, for example by a hole filled with conductive material. The through connection 122 extends from the first contact 106 on the first surface 102 to a second surface 124 of the substrate 100. On this second surface 124, a further electrically conductive layer 126 is formed, which substantially covers the lower surface 124 of the substrate 100, and which is in contact with the first contact 106 of the sensor device via the through connection 122.

In the embodiment illustrated in FIG. 2, on the sensor chip comprising the opposing contacts 106/112 and 108/114 on the one surface 102, a small hole through the substrate 100 is produced at the contact 106/112 for the through connection 122 to the reserve side 124. Preferably, this is performed in one procedural step for all sensors of a wafer or already on the "naked" substrate, i.e. before starting with the other procedural steps for the sensor manufacture (e.g. metal film deposition etc.), by introducing corresponding bores at the location in the substrate at which later the contact 106/112 of the chip is to be produced, for example by lasing or punching or the like.

In a further procedural step, this hole then becomes the through connection 122, e.g. by applying a metal paste by means of screen printing, which at the same time leads to the contract zone reinforcements 112, 114 shown in FIG. 2. Then preferably the entire area of the area of the substrate reverse side 124 substantial for the later further processing is metallized, wherein apart from the screen printing technique also other coating techniques (e.g. vapor disposition, sputtering, chemical coating, or combinations of these methods) may be applied. For the metallization, all suitable metals or metal pastes may be used, wherein here, only as an example, Ag, Au, Pt, Ni, Cu, W etc. as well as their alloys are mentioned. Furthermore, layer combinations of the mentioned materials may be used.

In the next step, the insulating layer 118, for example a dielectric layer, is applied over the contact area 106/112 at which the through connection 112 to the reverse side 124 was made. This layer may for example be applied in a thick-layer process by means of dielectric paste, wherein also the active sensor zone, which preferably may already be covered with the glaze 116 or another suitable protective cover, may be covered over. The second contact area 108/114 is at least not completely covered. The insulation layer may for example be a glaze similar to the glaze 116. But other suitable materials may be employed for the construction of the layer 118, e.g. glass ceramics, ceramics, or combinations of these materials. Furthermore, the layer 118 may be composed of several like or different sheets, whereby the insulation strength of the layer 118 may be increased.

In a subsequent step, the entire surface of the applied insulation layer 118 or at least a substantial part thereof is provided with the metallization layer 120, wherein this metallization layer 120 covers and electrically connects in particular also the contact zone 108/114, which comprises no through connection to the substrate reverse side 124. Hereby a conductive layer with a greater dimension than the contact results, so that lead wires may be mounted with increased reliability.

According to a preferred embodiment of the present invention, the manufacture of the devices described above on the basis of FIG. 2 takes place on wafer level, i.e. there are already a plurality of preferably identical devices on the wafer, which have a certain dimension from each other. In order to be able to split the processed devices, as they result after the steps according to FIG. 2, into individual devices, in one arrangement, in a marginal region of the substrate 100 on the wafer, smaller area regions are kept free, in which there are markings employed for dicing the wafer in individual components.

The above-described metallization 120 may preferably be again applied by a thick-layer process, but the other above-mentioned methods may also be employed.

Subsequently, on the basis of FIG. 3, a further preferred embodiment of the present invention is explained in more detail. As compared with FIG. 2, in the application of the pad on the front side of the substrate 100, the approach described there of the application of an insulation layer 118 and a conductive layer 120 is left behind. In stead, an insulating plate 128, preferably a ceramic plate having an area comprising about an area of the surface of the component to which it is to be mounted is used. The ceramic plate 120 includes a first surface 130 and a second surface 132. On the first surface 130, a conductive layer 132 is formed substantially over the entire surface of the plate 128. On the second surface 132 of the plate 128, a connecting layer is formed in a first area, and a conductive portion 138 in a second area. Furthermore, a through connection 140 is formed in the plate 128 to conductively connect the conductive layer 134 to the conductive portion 138. According to a preferred embodiment, the conductive portion 138 of the plate 128 is chosen in dimension, so that it corresponds to about the dimensions of the contact 108/114 of the component. The plate 128 is arranged on the component in the manner shown in FIG. 3, so that the conductive portion 238 is in connection with the contact area 108/114, wherein a mechanical connection between component and plate 128 is brought about via the connecting layer 236. Similar to FIG. 2, hereby an enlarged first pad 134 of the device is achieved.

As has been described above, the special embodiment, described with reference to FIG. 2, of the use of the dielectric layer 118 has been replaced, in accordance with FIG. 3, by a ceramic plate 128 prepared accordingly. The metallization 134 is provided on the whole of the face 130 facing towards the outside. At the predetermined position, the through connection 140 leads from the overall metallization 134 on the "outside" to the "inside" 132 exhibiting the partial-area metallization 138 which preferably has been arranged around the through connection. The metallized partial area 138 of the inside here is preferably congruent with the contact face 108/114 of the sensor element. The sensor and the plate are staked by means of the staking layer 136 or in any other suitable manner, so that a firm mechanical connection results between the two elements, and, simultaneously, a stable electrical connection of the contact face 108/114 with the inner metallization 138 of the ceramic plate 128 is established.

As a further alternative, the through connection for a connection to the reverse side may be replaced by a connection via an outer edge, in this case it being possible to dispense with the hole for the through connection. FIG. 4 depicts a device in accordance with this embodiment, wherein, similarly to FIG. 3, a ceramic plate 128 is provided on the upper face. Unlike FIG. 3, however, the surface 132, facing towards the inside, here is fully covered by the connecting layer 136. Thus, no conductive area 138 and no through connection 140 are provided. As may also be seen from FIG. 4, the component also exhibits no through connection, as is shown in FIGS. 2 and 3.

For connecting the first contact 106/112 to the reverse-side pad 126, a conductive layer 142 is provided which extends from the first contact 106/112 across a side face 144, which connects the upper face 102 and the lower face 124 of the substrate, to the conductive layer 126. Similarly, the second contact 108/114 is connected to the upper pad 134, to be precise via a further conductive layer 146 which extends from the second contact 108/114 across a side face 147, which connects the surfaces 132 and 134, of plate 128 to the conductive layer 134.

Figure 3:
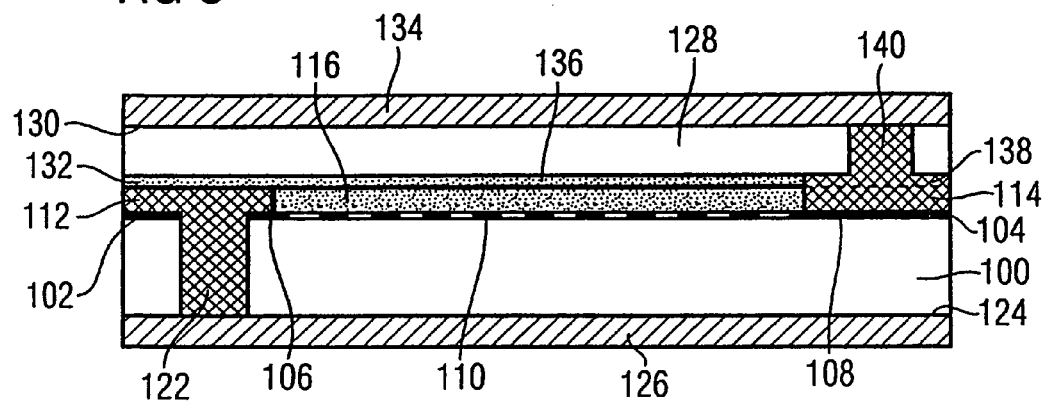
FIG. 3 is a device according to a preferred embodiment of the present invention.
Figure 4:
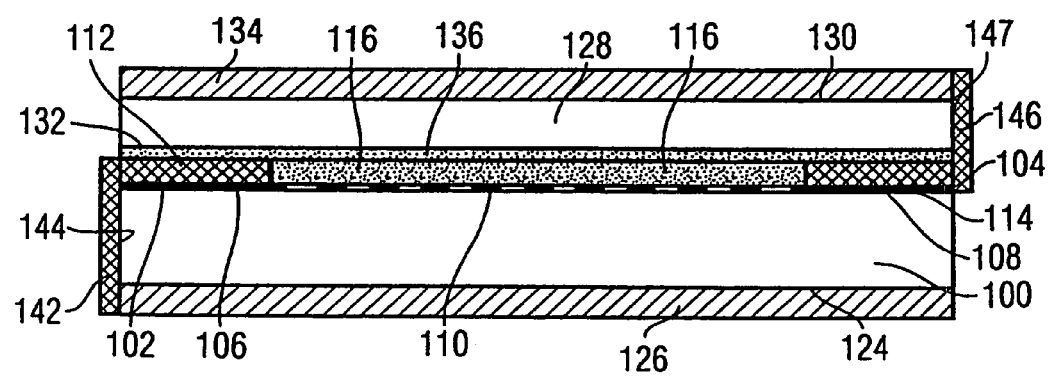
FIG. 4 is a device according to the present invention according to a third embodiment.

It shall be pointed out with reference to FIG. 4 that for enlarging the upper pad, use may also be made of the approach shown in FIG. 3, i.e. the utilization of the plate having through connection 140. In this case, only the contact 106/112 is formed across the conductive layer 144 to the lower layer 126. Alternatively, it is also possible to contact the lower layer 126 via the through connection 122, and to contact only the second contact 108/114 via layer 146 via the outside to the upper layer 134.

In addition, in situations where it is only desirable to provide the pads on opposed main surfaces, it may be sufficient to lead only the first contact 106/112 onto the reverse side 124 of substrate 100, and to connect it to a conductive layer of any size, i.e. a layer which does not necessarily have to cover the entire lower surface of substrate 100. In this case, the second contact 108/114 may remain the same as it has been originally, i.e. the steps relating to the connection to a pad 134, which have been described above, are dispensed with in this case.

Figure 5:
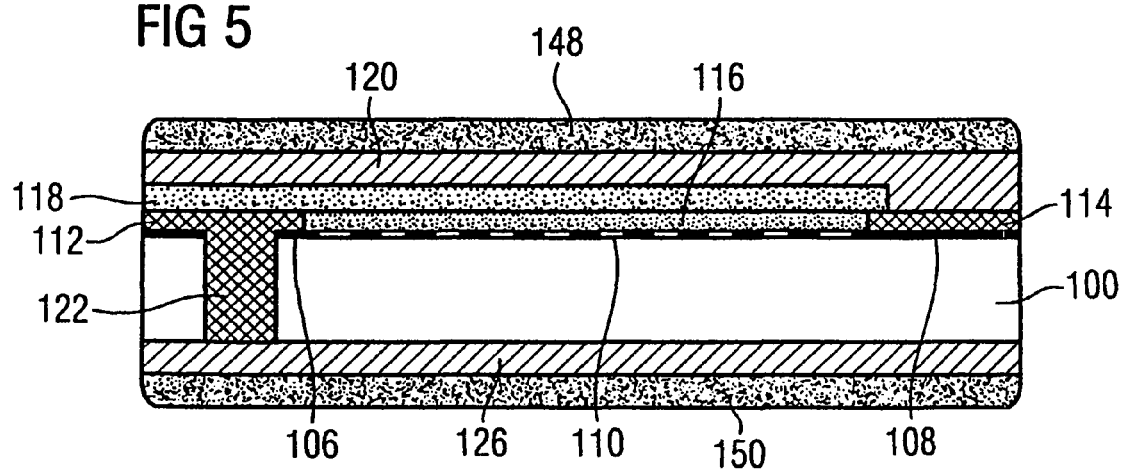
FIG. 5 is the inventive device with applied solder layer.

For further processing, the devices/sensors described with reference to FIGS. 2 and 4 are provided with a further metallization layer. FIG. 5 depicts a device which has been described with reference to FIG. 2, these further metallization layers 148 and 150. Metallization layer 148 is arranged on the upper conductive pad 120, and metallization layer 150 is arranged on the lower conductive pad 126. These metallization layers are, for example, solder-tin layers for soldering on lead wires, or thin gold layers serving as a welding aid so as to be able to connect the sensor chips to lead wires, cables or the like.

Figure 6:
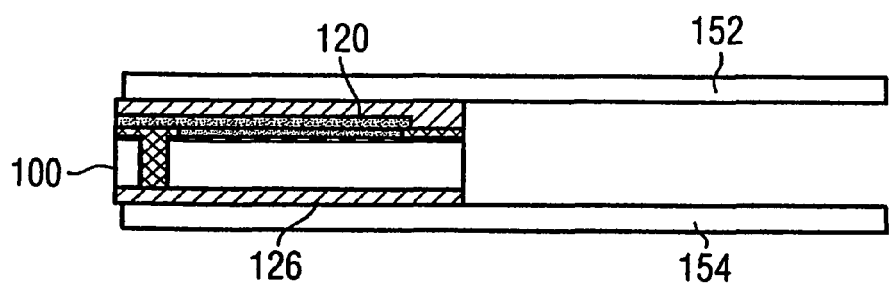
FIG. 6 is an inventive device with lead wires attached thereto.

This further connection to lead wires is schematically shown in FIG. 6, where a first lead wire 152 and a second lead wire 154 are shown, lead wire 152 being secured to pad 120, and lead wire 154 being secured to pad 126. Depending on the applications, the wires are welded on at elevated operational temperatures, and are soldered onto the connection of the lead wires to the device at lower application temperatures.

Figure 7:
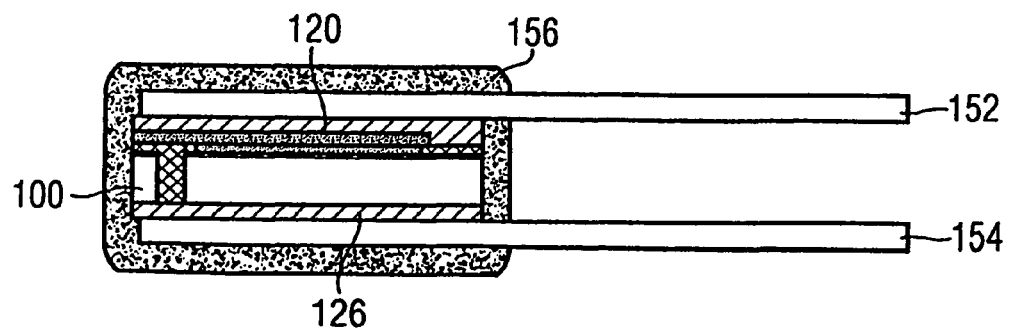
FIG. 7 is the example shown in FIG. 6 with additional cladding.

In addition, the device and lead wires 152, 154 may be provided with a cladding in the area where they are secured to same, as is diagrammatically shown at 156 in FIG. 7. For application cases where elevated operational temperatures are used, a glaze or a suitable ceramic material is used as the cladding 156, which leads to mechanical hardening and offers additional chemical protection. For relatively low application temperatures, a cladding that may be provided may consist of a polymer material, e.g. epoxide resin. In addition, layer combinations of the materials mentioned may also be used for the cladding.

The devices described above are preferably produced at the wafer level, so that providing the component includes providing a wafer having a plurality of the components. The above-mentioned layers are then produced at the wafer level, the devices eventually being diced.

A device in accordance with a fourth embodiment of the present invention will be described below with reference to FIG. 8. Unlike the embodiments described above, the conductive layers forming the pads in this case are not arranged on the main surfaces of the sensor chip, but on the side faces connecting the main surfaces. In this case, a thickness of the substrate of the component is selected to be larger than a maximum dimension of the contacts, whereby a pad is obtained which is enlarged in comparison with the contacts.

Figure 8:
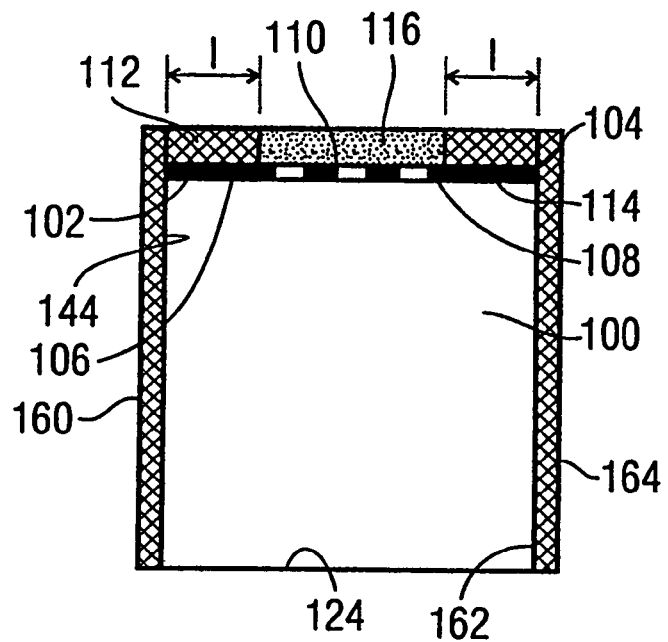
FIG. 8 is a device according to the present invention according to a fourth embodiment.

FIG. 8 shows the sensor chip with substrate 100. As may be seen, the thickness of substrate 100 is larger than an extension 1 of contacts 106/112 and/or 108/114. A first conductive layer 160 is formed as the first pad of the device on the first side face 144 connecting the first surface 102 and the second surface 124. A second conductive layer 164 is formed as the second pad of the device on a second side face 162 connecting the first and second surfaces 102 and 124.

Figure 9:
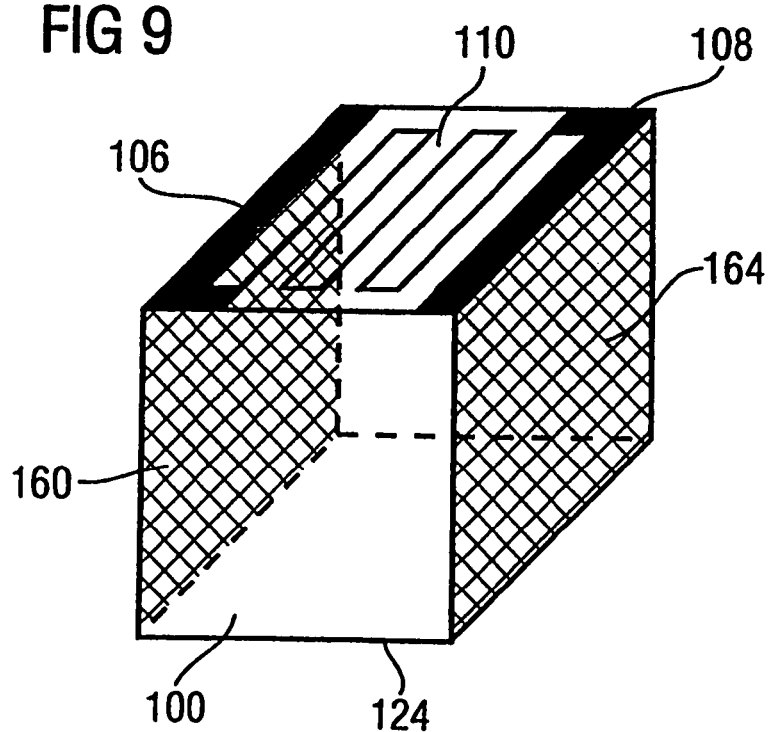
FIG. 9 is an isometric illustration of the device from FIG. 8.

FIG. 9 is an isometric representation of the device of FIG. 8.

The devices described with reference to FIGS. 8 and 9 are preferably manufactured at the wafer level, a plurality of the components then being provided on a wafer. To manufacture the conductive layers 160, 164, saw cuts are introduced into the wafer to create depressions between the elements. A conductive material is introduced into these saw cuts. Eventually, the devices are diced, e.g. by sawing, breaking, etc.

The devices described with reference to FIGS. 8 and 9 may be further processed in accordance with FIGS. 6 and 7.

Even though the above description is one of preferred embodiments in which the contacts are shown at opposed edges of the substrate, it is to be pointed out that the present invention is not limited to this implementation, but that the contacts may be disposed at any positions on the first surface, e.g. next to one another.

Although specific embodiments regarding the manufacturing process were described, it is noted that the present invention is not restricted to the sequence of steps given in the respective embodiments. Dependent on the technical situation, the respective steps can be performed at a different sequence different from the one describes above. Especially, the second conductive layer can be formed before the first conductive layer. Also, the producing of the conductive connection between the first contact and the lower surface can be done prior or after forming the conductive layers.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A temperature measurement sensor, comprising:
    a ceramic substrate having upper and lower surfaces, the upper surface having a first contact and a second contact formed thereon, between which a structured measurement film is arranged;
    an electrically conductive through hole connection in the ceramic substrate of the temperature measurement sensor, the conductive through hole connection extending from the first contact through the ceramic substrate to the lower surface of the ceramic substrate;
    a first conductive layer disposed on the lower surface of the ceramic substrate such that the first conductive layer is in contact with the conductive through hole connection, thereby defining a first pad of the temperature measurement sensor on the lower surface thereof;
    an insulating layer disposed on the upper surface of the ceramic substrate such that the first contact and the measurement film are covered by the insulating layer, and such that the second contact is at least partially exposed; and
    a second conductive layer disposed on the insulating layer of the ceramic substrate such that the second conductive layer is in contact with the second contact, thereby defining a second pad of the temperature measurement sensor on the upper surface thereof and wherein the first and second conductive layers overlap in a thickness direction with the structured measurement film disposed therebetween.

2. The temperature measurement sensor of claim 1, wherein the insulating layer includes an insulating plate having a dimension which substantially corresponds to a dimension of the temperature measurement sensor, the plate having a first surface, on which the second conductive layer is formed, a second surface which is opposite the first surface and has a conductive portion in a predetermined area, and a conductive through connection connecting the second conductive layer on the first surface of the plate and the conductive portion on the second surface of the plate;
    wherein a connecting layer is provided on the upper surface of the temperature measurement sensor and/or on the second surface of the plate; and
    wherein the plate and the temperature measurement sensor are stacked such that the second contact of the temperature measurement sensor is in contact with the conductive portion of the plate, whereby the conductive layer on the first surface of the plate forms the second pad of the device.

3. A method of producing a temperature measurement sensor, comprising the steps of:
    providing the temperature measurement sensor including a ceramic substrate having upper and lower surfaces, a first contact and a second contact being formed on the upper surface, between which contacts a structured measurement film is disposed;
    producing an electrically conductive through hole connection in the ceramic substrate of the temperature measurement sensor, the conductive through-hole connection extending from the first contact through the ceramic substrate to the lower surface of the ceramic substrate;
    producing a first conductive layer on the lower surface of the ceramic substrate such that the first conductive layer is in electrically conductive contact with the conductive through hole connection, thereby defining a first pad of the temperature measurement sensor on the lower surface thereof;
    producing an insulating layer on the upper surface of the ceramic substrate such that the first contact and the measurement film are covered by the insulating layer, and such that the second contact is at least partially exposed; and
    producing a second conductive layer on the insulating layer such that the second conductive layer is in electrically conductive contact with the second contact, thereby defining a second pad of the temperature measurement sensor on the upper surface thereof and wherein the first and second conductive layers overlap in a thickness direction with the structured measurement film disposed therebetween.

4. The method of claim 1, wherein the steps of producing the insulating layer and of producing the second conductive layer include the steps of:
    providing an insulating plate having a dimension which substantially corresponds to a dimension of the temperature measurement sensor, the plate having a first surface, on which a conductive layer is formed, a second surface which is opposite the first surface and has a conductive portion in a predetermined area, and a conductive through connection connecting the conductive layer on the first surface of the plate and the conductive portion on the second surface of the plate;
    depositing a connecting layer onto the upper surface of the temperature measurement sensor and/or onto the second surface of the plate; and
    stacking the plate and the temperature measurement sensor such that the second contact of the temperature measurement sensor is in contact with the conductive portion of the plate, whereby the conductive layer on the first surface of the plate forms the second pad of the device.

5. The method of claim 1, wherein the step of producing the conductive connection includes producing a conductive layer extending from the first contact of the temperature measurement sensor across a side face, which connects the upper surface and the lower surface, to the first conductive layer on the lower surface of the temperature measurement sensor.

6. The method of claim 1, wherein the step of providing the temperature measurement sensor includes providing a wafer having a plurality of the temperature measurement sensors, the method further including dicing the temperature measurement sensors.

7. The method of claim 1, comprising the step of:
connecting a first lead wire to the first pad, and a second lead wire to the second pad.

8. The method of claim 7, comprising the step of:
producing a cladding surrounding the temperature measurement sensor and the lead wires in the area of the connection to the pads.

9. The method of claim 8, wherein the lead wires are welded on or soldered on, and the cladding is a glaze, a ceramic material, a polymer material or a layer combination of several of same.

* * * * *

UNITED STATES PATENT AND TRADEMARK OFFICE
CERTIFICATE OF CORRECTION

PATENT NO. : 7,746,213 B2  Page 1 of 1
APPLICATION NO. : 11/450713
DATED : June 29, 2010
INVENTOR(S) : Zitzmann et al.

It is certified that error appears in the above-identified patent and that said Letters Patent is hereby corrected as shown below:

Claim 4, column 10, line 47, after "The method of claim," replace "1" with "3".

Claim 5, column 11, line 1, after "The method of claim," replace "1" with "3".

Claim 6, column 11, line 7, after "The method of claim," replace "1" with "3".

Claim 7, column 11, line 1, after "The method of claim," replace "1" with "3".

Signed and Sealed this

Twenty-sixth Day of October, 2010

David J. Kappos
*Director of the United States Patent and Trademark Office*